(12) United States Patent
Chern

(10) Patent No.: US 10,726,894 B2
(45) Date of Patent: Jul. 28, 2020

(54) NON-VOLATILE MEMORY CELL, ARRAY AND FABRICATION METHOD

(71) Applicant: NEXCHIP SEMICONDUCTOR CO., LTD, Hefei, Anhui (CN)

(72) Inventor: Geeng-Chuan Chern, Hefei (CN)

(73) Assignee: Nexchip Semiconductor Co., Ltd, Xinzhan District, Hefei, Anhui (CN)

( * ) Notice: Subject to any disclaimer, the term of this patent is extended or adjusted under 35 U.S.C. 154(b) by 24 days.

(21) Appl. No.: 16/199,184

(22) Filed: Nov. 25, 2018

(65) Prior Publication Data
US 2020/0027492 A1  Jan. 23, 2020

(51) Int. Cl.
*G11C 16/04* (2006.01)
*G11C 11/16* (2006.01)
*H01L 27/11517* (2017.01)
*H01L 21/8234* (2006.01)
*G11C 8/14* (2006.01)
*G11C 29/00* (2006.01)

(52) U.S. Cl.
CPC ............ *G11C 11/1657* (2013.01); *G11C 8/14* (2013.01); *H01L 21/82345* (2013.01); *H01L 27/11517* (2013.01); *G11C 16/0483* (2013.01); *G11C 29/82* (2013.01)

(58) Field of Classification Search
CPC .............................. G11C 29/82; G11C 16/0483

USPC ....................................... 365/185.09; 257/316
See application file for complete search history.

(56) References Cited

U.S. PATENT DOCUMENTS 5,751,631 A * 5/1998 Liu ..................... G11C 16/0483
257/316

* cited by examiner

*Primary Examiner* — Jason Lappas
(74) *Attorney, Agent, or Firm* — Global IP Services; Tianhua Gu

(57) ABSTRACT

The present invention provides a non-volatile memory cell, array and fabrication method. The memory cell comprises a substrate, a gate structure, a source region and a drain region, wherein the gate structure is formed on the substrate, the gate structure sequentially comprises a first gate dielectric layer, a first conductive layer, a second gate dielectric layer and a second conductive layer from bottom to top, the source region is formed in the substrate, the source region comprises an N-type heavily doped source region, the drain region is formed in the substrate, the drain region comprises an N-type doped drain region and a P-type heavily doped drain region formed in the N-type doped drain region. The non-volatile memory cell and array provided by the present invention have a band-to-band tunneling programming ability and reserve the advantage of high reading current of an N-channel at the same time.

20 Claims, 16 Drawing Sheets

NON-VOLATILE MEMORY CELL, ARRAY AND FABRICATION METHOD

BACKGROUND OF THE PRESENT INVENTION

Field of Invention

The present invention belongs to the technical field of semiconductors, and relates to a band-to-band tunneling programming N-channel non-volatile memory cell, array and fabrication method.

Description of Related Arts

A non-volatile memory (NVM) refers to a computer memory with stored data which will not disappear after power supply is cut off. The non-volatile memory may be divided into two major products, i.e., Read-Only Memory (ROM) and Flash memory according to a criteria whether data in the memory can be rewritten anytime in use of a computer. The characteristic of the Read-only memory is that once data is stored, the data cannot be changed or deleted any more, and contents will not disappear because power is cut off. The Read-only memory is usually used for storing programs or data which do not need to be frequently changed in an electronic or computer system. The Flash memory is a form of electronic erasable programming read-only memory, which is allowed to be repetitively erased or written during operation. This technology is mainly used for storing common data and exchanging and transmitting data between computers and other digital products, such as memory cards and USB flash disks.

By using a Band-to-Band (BB) tunneling mechanism, P-channel Non-Volatile Memories (NVMs) have an advantage of low programming current (<1 uA). However, P-channel non-volatile memories have a disadvantage that cell reading current is low because hole mobility is lower than electron mobility.

Therefore, how to provide a dual-layer polycrystalline silicon NVM cell and array to have a band-to-band tunneling programming ability and reserve the advantage of relatively high reading current of an N-channel at the same time becomes an important technical problem which needs to be urgently solved by those skilled in the art.

SUMMARY OF THE PRESENT INVENTION

In view of the above-mentioned disadvantages of the prior art, the purpose of the present invention is to provide a band-to-band tunneling programming N-channel non-volatile memory cell, array and fabrication method, which are used for solving the problem that the non-volatile memory in the prior art that cannot simultaneously have low programming current and high reading current.

In order to realize the above-mentioned purpose and other related purposes, the present invention provides a band-to-band tunneling programming N-channel non-volatile memory cell, comprising:

a substrate;

a gate structure formed on the substrate, wherein the gate structure sequentially comprises a first gate dielectric layer, a first conductive layer, a second gate dielectric layer and a second conductive layer from bottom to top;

a source region formed in the substrate, wherein the source region comprises an N-type heavily doped source region; and a drain region formed in the substrate, wherein the drain region comprises an N-type doped drain region and a P-type heavily doped drain region formed in the N-type doped drain region, wherein the source region and the drain region are respectively located at two ends of the gate structure, and the N-type doped drain region and the P-type heavily doped drain region both horizontally extend to positions below the gate structure and partially overlap with the gate structure.

Alternatively, the source region further comprises an N-type lightly doped source region, wherein the N-type lightly doped source region is connected to two ends of the N-type heavily doped source region, horizontally extends to a position below the gate structure and partially overlaps with the gate structure.

Alternatively, the non-volatile memory cell further comprises a sidewall spacer, wherein the sidewall spacer is formed on both sides of the gate structure.

Alternatively, the non-volatile memory cell further comprises a silicide layer, wherein the silicide layer is distributed on a surface of the second conductive layer, a surface of the P-type heavily doped drain region and a surface of the N-type heavily doped source region.

Alternatively, the non-volatile memory cell further comprises an interlayer dielectric layer, a metal bit line and at least one contact plug, wherein the interlayer dielectric layer is formed on the substrate and covers the gate structure, the metal bit line is formed on the interlayer dielectric layer, the contact plug is formed in the interlayer dielectric layer, a top end of the contact plug is connected to the metal bit line, and a bottom end of the contact plug is connected to the drain region.

Alternatively, the substrate is a P-type doped substrate.

Alternatively, the substrate is a triple-well structure comprising an N-well formed in the substrate and a P-well formed in the N-well.

Alternatively, a thickness range of the first gate dielectric layer is 7 nm-15 nm, a thickness of the first conductive layer is in a range of 30 nm-200 nm, and a thickness of the second conductive layer is in a range of 80 nm-250 nm.

Alternatively, a material of the first gate dielectric layer comprises any one of oxide and oxynitride, a material of the second gate dielectric layer comprises any one of oxide and nitride, or the second gate dielectric layer sequentially comprises a first oxide layer, a nitride layer and a second oxide layer from bottom to top, a thickness of the first oxide layer is in a range of 3 nm-7 nm, a thickness of the nitride layer is in a range of 4 nm-8 nm, and a thickness of the second oxide layer is in a range of 3 nm-7 nm.

Alternatively, a material of the first conductive layer comprises N-type polycrystalline silicon, and a material of the second conductive layer comprises N-type polycrystalline silicon.

Alternatively, a dosage of the N-type doped drain region is in a range of $1E13\ cm^{-2}$-$9E14\ cm^{-2}$, a dosage of the P-type heavily doped drain region is in a range of $1E15\ cm^{-2}$-$8E15\ cm^{-2}$, and a dosage of the N-type heavily doped source region is in a range of $1E15\ cm^{-2}$-$9E16\ cm^{-2}$.

The present invention further provides a band-to-band tunneling programming N-channel non-volatile memory array, and the band-to-band tunneling programming N-channel non-volatile memory array comprises any one of the above-mentioned non-volatile memory cells.

The present invention further provides a method for fabricating a non-volatile memory, comprising the following steps:

providing a substrate;

forming a gate structure on the substrate, wherein the gate structure sequentially comprises a first gate dielectric layer, a first conductive layer, a second gate dielectric layer and a second conductive layer from bottom to top;

forming a source region in the substrate, wherein the source region comprises an N-type heavily doped source region; and forming a drain region in the substrate, wherein the drain region comprises an N-type doped drain region and a P-type heavily doped drain region formed in the N-type doped drain region, wherein the source region and the drain region are respectively located at two ends of the gate structure, and the N-type doped drain region and the P-type heavily doped drain region both horizontally extend to positions below the gate structure and partially overlap with the gate structure, respectively.

Alternatively, forming the N-type doped drain region and the P-type heavily doped drain region comprises the following steps:

performing N-type ion implantation in the drain region;

performing P-type ion implantation in the drain region, wherein an implantation depth of P-type ions is smaller than an implantation depth of N-type ions; and performing a anneal cycle to obtain the N-type doped drain region and the P-type heavily doped drain region.

Alternatively, an energy of the N-type ion implantation is in a range of 50 KeV-100 KeV, a dosage is in a range of 1E13 cm$^{-2}$-9E14 cm$^{-2}$, an energy of the P-type ion implantation is in a range of 5 KeV-30 KeV, and a dosage is in a range of 1E15 cm$^{-2}$-8E15 cm$^{-2}$.

Alternatively, forming the N-type heavily doped source region comprises the following steps:

performing N-type ion implantation in the source region; and performing a an anneal cycle to obtain the N-type heavily doped source region.

Alternatively, a dosage of the N-type ion implantation is in a range of 1E15 cm$^{-2}$-9E16 cm$^{-2}$.

Alternatively, before forming the N-type heavily doped source region, the method further comprises the following steps:

forming an N-type lightly doped source region in the source region; and forming a sidewall spacer on both sides of the gate structure, wherein two ends of the N-type heavily doped source region are connected to the N-type lightly doped source region.

Alternatively, the method further comprises the following steps:

forming a self-aligned silicide layer on a surface of the second conductive layer, a surface of the P-type heavily doped drain region and a surface of the N-type heavily doped source region;

forming an interlayer dielectric layer on the substrate to cover the gate structure;

forming a contact plug in the interlayer dielectric layer, wherein a bottom end of the contact plug is connected to the drain region; and forming a metal bit line on the interlayer dielectric layer, wherein a top end of the contact plug is connected to the metal bit line.

Alternatively, the substrate is a triple-well structure comprising an N-well formed in the substrate and a P-well formed in the N-well.

As described above, the non-volatile memory cell, array and fabrication method thereof provided by the present invention have the following beneficial effects: the non-volatile memory cell provided by the present invention adopts a dual-layer conductive layer (which may be polycrystalline silicon) structure, wherein a lower conductive layer is used as a floating gate, an upper conductive layer is used as a word line, when the non-volatile memory cell and array provided by the present invention are programmed, band-to-band tunneling occurs from the P-type heavily doped drain region to the N-type doped drain region of the drain region, thus causing impact ionization, so that electrons are directly implanted from the drain region to the floating gate, while no channel current is generated, the number of required electrons is greatly reduced and the programming current is relatively low. When the non-volatile memory cell and array provided by the present invention are read, electrons flow from the source region to the drain region and relatively high N-channel current is generated. When the non-volatile memory cell and array provided by the present invention are erased, charges stored in the floating gate conductive layer penetrate through the first gate dielectric layer by means of direct FN tunneling and enter the substrate and/or source-drain regions, the erasing gate can be divided into sectors or blocks, and an erasing operation can be performed on the sectors or blocks under this situation. The non-volatile memory cell and array provided by the present invention have a band-to-band tunneling programming ability and reserve the advantage of relatively high reading current of an N-channel at the same time.

| Description of component numbers | |
|---|---|
| 100 | Memory array |
| 101 | Bit line |
| 102 | Word line |
| 103 | Source line |

-continued

| | Description of component numbers |
|---|---|
| 104 | Floating gate |
| 105 | Active region |
| 106 | Contact |
| 200, 201 | View |
| 202 | Substrate |
| 203 | Shallow trench isolation oxide layer |
| 204 | First gate dielectric layer |
| 205 | First conductive layer |
| 206, 209, 210, 213 | Photoresist |
| 207 | Second gate dielectric layer |
| 208 | Second conductive layer |
| 211 | N-type doped drain region |
| 212 | P-type heavily doped drain region |
| 214 | N-type heavily doped source region |
| 215 | N-type lightly doped source region |
| 216 | Sidewall spacer |
| 217 | Silicide layer |
| 218 | Interlayer dielectric layer |
| 219 | Contact plug |
| 220 | Metal bit line |
| 221 | First parasitic diode |
| 222 | Second parasitic diode |

DETAILED DESCRIPTION OF THE PREFERRED EMBODIMENTS

The implementation modes of the present invention will be described below through specific examples. One skilled in the art can easily understand other advantages and effects of the present invention according to contents disclosed in the description. The present invention may also be implemented or applied through other different specific implementation modes. Various modifications or variations may be made to all details in the description based on different points of view and applications without departing from the spirit of the present invention.

Referring to FIG. 1A to FIG. 17, it needs to be stated that the drawings provided in this embodiment are just used for schematically describing the basic concept of the present invention, thus only illustrate components only related to the present invention and are not drawn according to the numbers, shapes and sizes of components during actual implementation, the configuration, number and scale of each component during actual implementation thereof may be freely changed, and the component layout configuration thereof may be more complex.

Figure 1A:
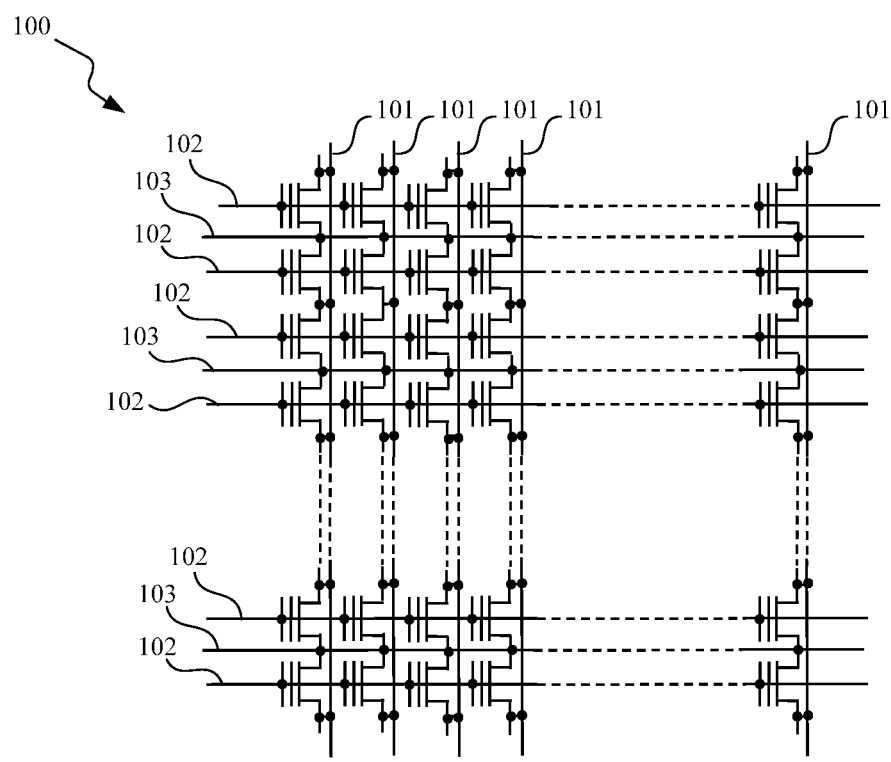
FIG. 1A illustrates an exemplary circuit diagram of a band-to-band tunneling programming N-channel non-volatile memory array provided by the present invention.

The band-to-band tunneling programming N-channel non-volatile memory array provided by the present invention comprises a plurality of band-to-band tunneling programming N-channel non-volatile memory cells. FIG. 1A illustrates an exemplary circuit diagram of a band-to-band tunneling programming N-channel non-volatile memory array 100 provided by the present invention. The memory array 100 comprises at least a bit line 101, a word line 102 and a source line 103.

During operation, a memory system applies suitable signals to the bit line and the word line to select a separate memory cell. The memory system can read data from the memory cell, program the memory cell or erase the memory cell. The memory cell may be realized by using a memory transistor which is further described below.

Figure 1B:
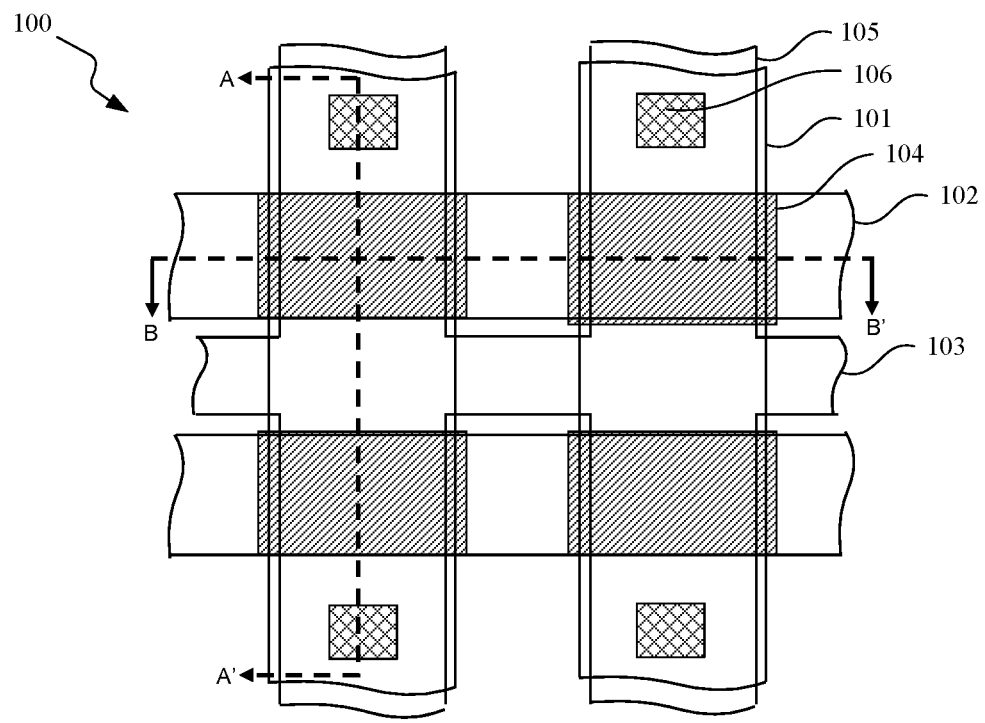
FIG. 1B illustrates a top view of the above exemplary memory array.

FIG. 1B illustrates a top view of the above-mentioned exemplary memory array 100. The memory array 100 comprises at least a bit line 101, a word line 102, a source line 103, a floating gate 104, an active region 105 and a contact 106, wherein the bit line 101 may be realized through a metal bit line, the floating gate 104 may be realized through a first conductive layer, the word line 102 may be realized through a second conductive layer, and the source line 103 may be realized through an active layer comprising a transistor channel and source-drain regions. FIG. 1B also illustrates two cross section view planes by using dashed lines, including a first dashed line from A to A' and a second dashed line from B to B'.

FIG. 2A to FIG. 14B illustrate a fabrication process of an N-channel non-volatile memory having a band-to-band tunneling programming ability, each drawing illustrates a different stage of the memory during the fabrication process. These drawings illustrate the memory from two different cross section views (view 200 and view 201). Referring to FIG. 1B again, view 200 illustrates a cross section view of a memory transistor along the first dashed line from A to A', and view 201 illustrates a cross section view of a memory transistor along the second dashed line from B to B'.

Figure 2A:
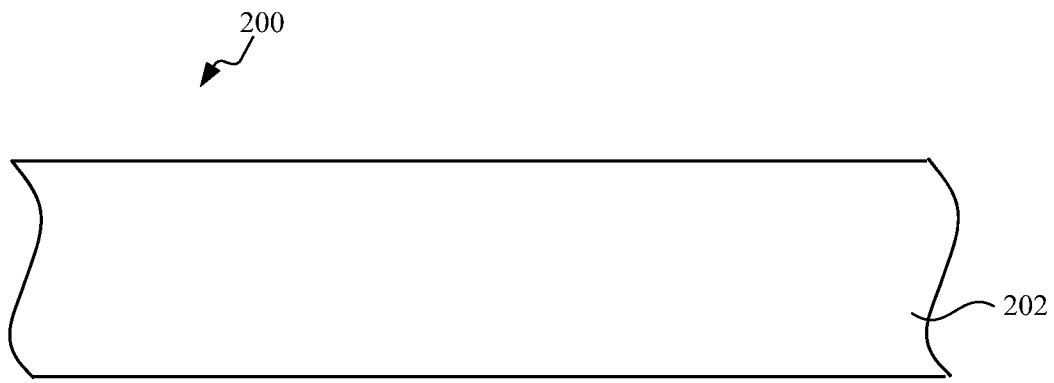
FIGS. 2A-2B, 3A-3B, 4A-4B, 5A-5B, 6A-6B, 7A-7B, 8A-8B, 9A-9B, 10A-10B, 11A-11B, 12A-12B, 13A-13B, and 14A-14B illustrate an exemplary fabrication process of an N-channel non-volatile memory having a band-to-band tunneling programming ability provided by the present invention.
Figure 2B:
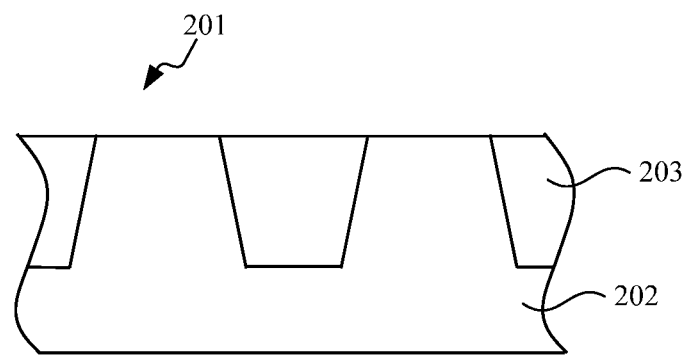

In FIG. 2A and FIG. 2B, the memory transistor comprises a substrate 202 and a Shallow Trench Isolation (STI) oxide layer 203, wherein the substrate 202 may adopt a P-type doped substrate, and the STI oxide layer 203 may be realized through standard STI process steps and is used for defining an active region in the substrate 202.

As an alternative solution, a triple-well structure may also be adopted for replacing a pure P-type substrate, e.g., the P-type substrate comprises a relatively deep N-well and a P-well is formed in the N-well.

Figure 3A:
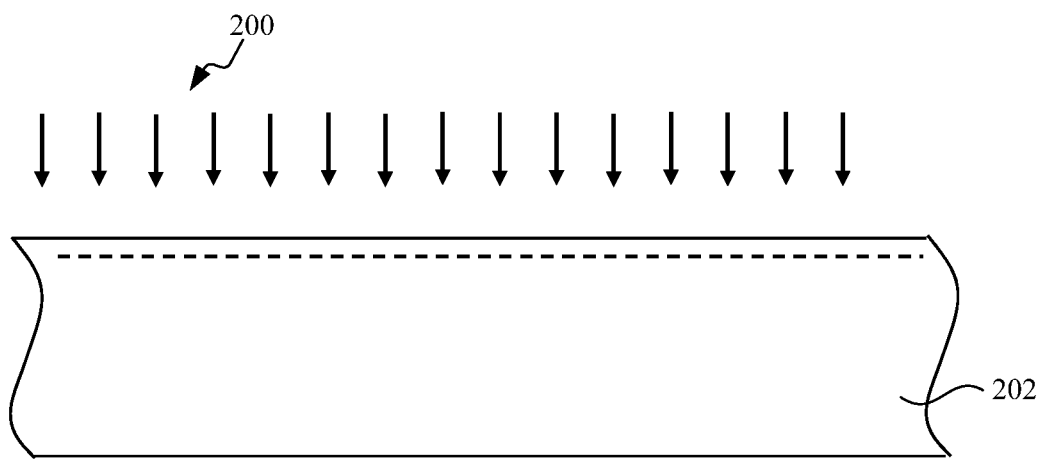
Figure 3B:
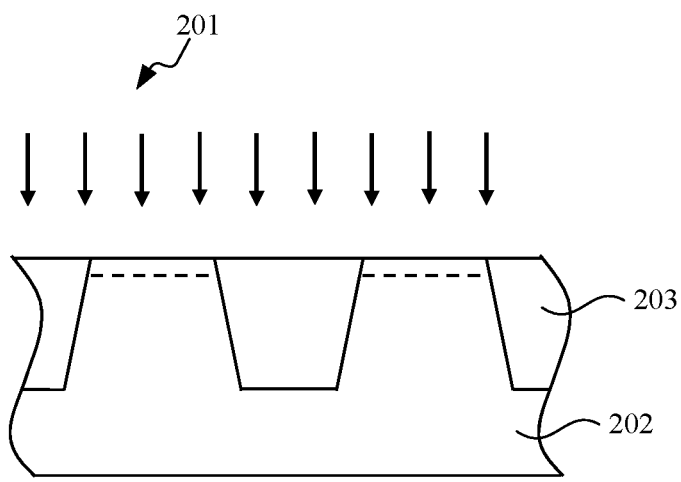
Figure 4A:
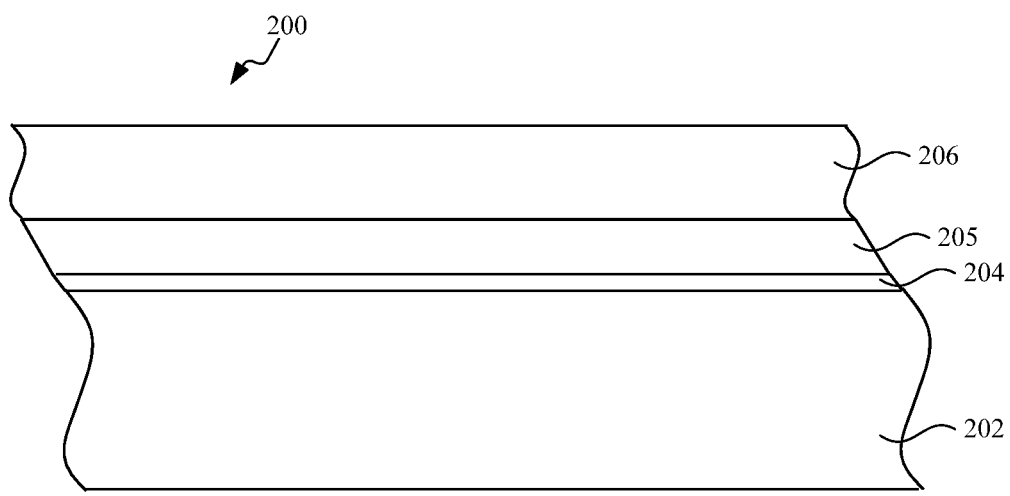
Figure 4B:
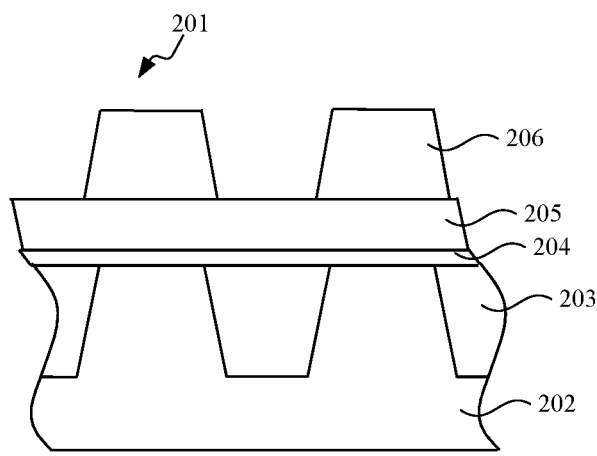

In FIG. 3A and FIG. 3B, firstly a photoresist pattern is formed to cover a peripheral region and expose an array region (not shown), then boron or boron fluoride ($BF_2$) are adopted and implanted to realize threshold adjustment, and then a Rapid Thermal Anneal (RTA) process is adopted to repair implantation damages and activate the dopant. Herein, FIG. 4A and FIG. 4B illustrate threshold adjustment implantation positions by using dashed lines, and illustrate implantation directions of B or $BF_2$ by using arrows. In this embodiment, an implantation direction is preferably y direction, i.e., vertical implantation is adopted. In other embodiments, inclined implantation may also be adopted. However, it would be better that an inclination angle is not greater than 7°, so as to avoid a channeling effect. In this embodiment, an ion implantation dosage range is $1E12$ $cm^{-2}$-$8E13$ $cm^{-2}$.

It needs to be pointed out that, in the technical solution of the present invention, it is an alternative solution to perform threshold adjustment by means of ion implantation and this step may also be omitted in other embodiments.

In FIG. 4A and FIG. 4B, firstly a first gate dielectric layer 204 is formed on the substrate 202, then a first conductive layer 205 is formed on the first gate dielectric layer 204 and then a patterned photoresist 206 is formed on the first conductive layer 205, so as to define a Floating Gate (FG) in y direction (vertical direction).

Specifically, a material of the first gate dielectric layer 204 comprises any one of oxide (such as silicon oxide) and oxynitride (such as silicon oxynitride), a thickness range of the first gate dielectric layer 204 is 7 nm-15 nm, a thickness range of the first conductive layer 205 is 30 nm-200 nm. In this embodiment, a material of the first conductive layer 205 adopts N-type polycrystalline silicon. The patterned photoresist may be realized through a photolithographic process.

Figure 5A:
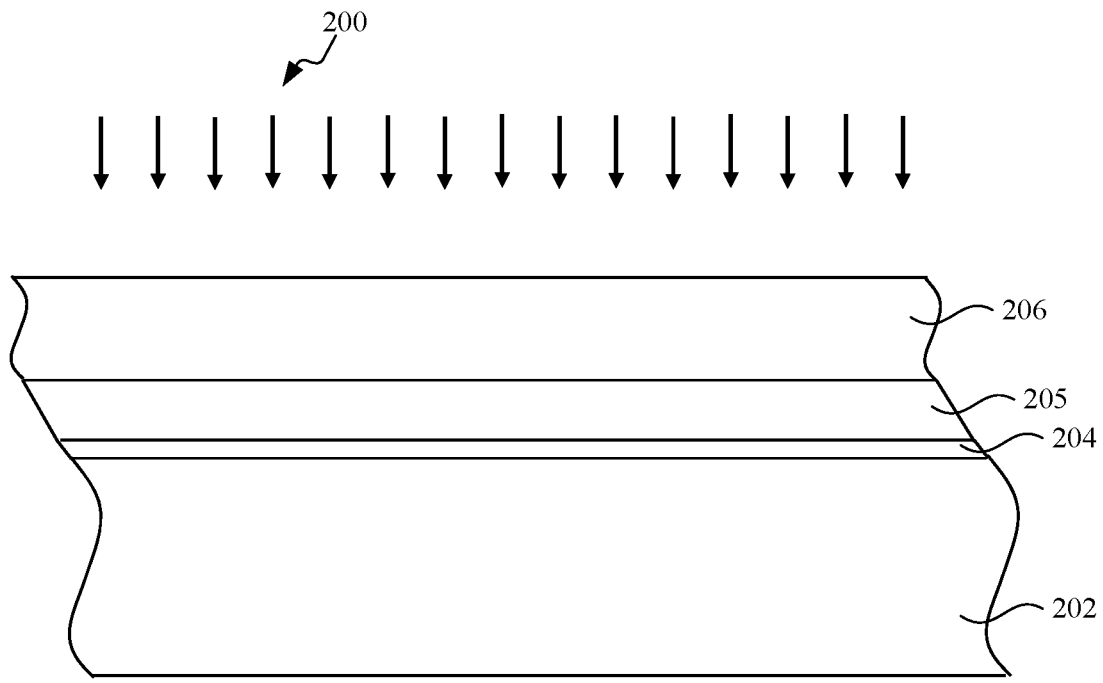
Figure 5B:
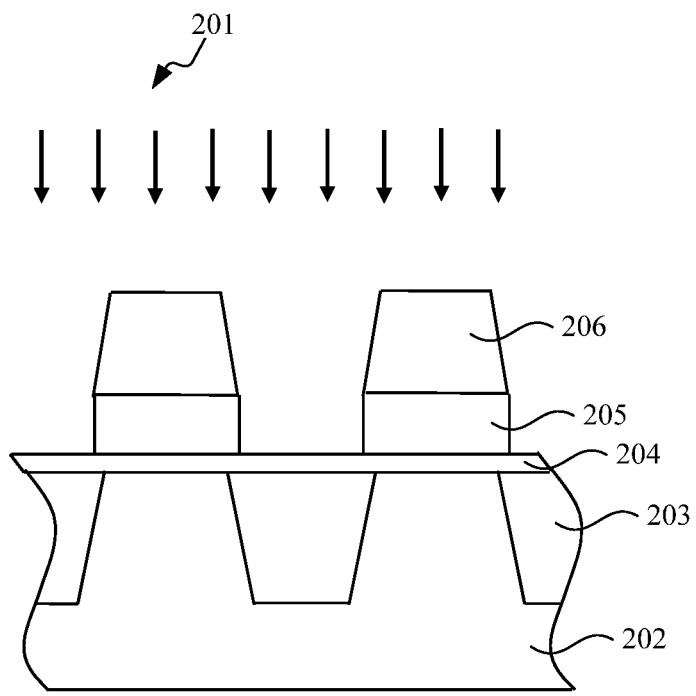

In FIG. 5A and FIG. 5B, anisotropic dry etching is adopted to remove the portion, which is not covered by the photoresist 206, of the first conductive layer 205, to obtain a plurality of floating gates. FIG. 5A and FIG. 5B illustrate directions of anisotropic etching by using arrows. In this embodiment, the direction of anisotropic etching is y direction, i.e., vertical etching is performed.

Figure 6A:
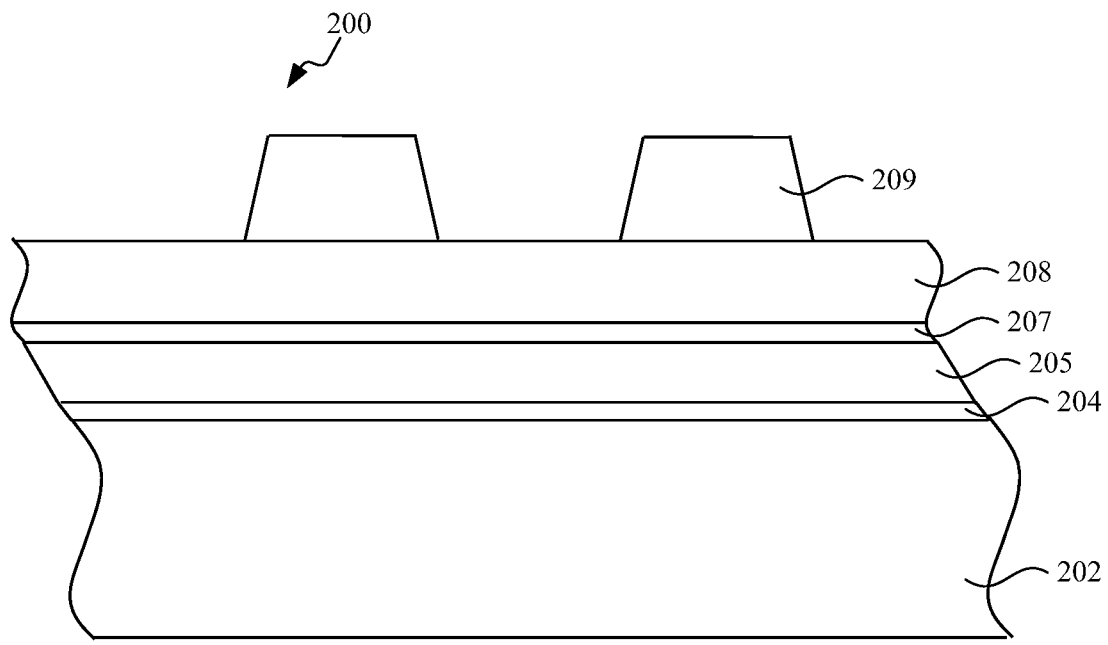
Figure 6B:
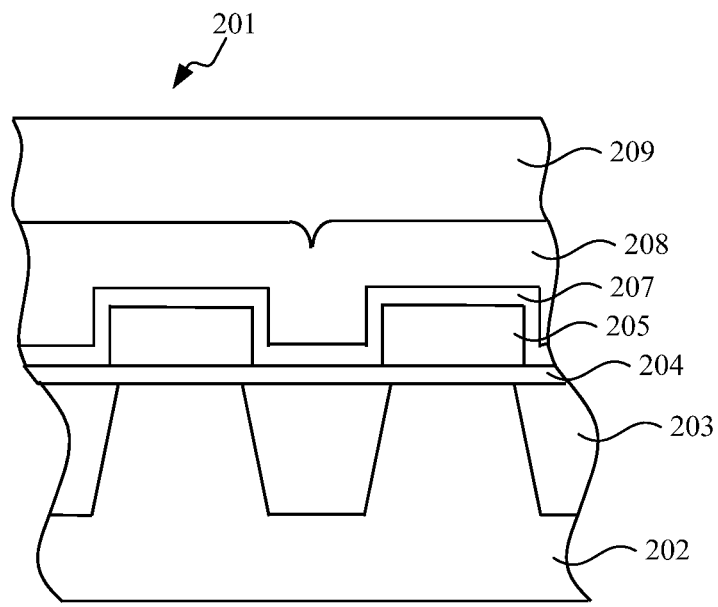

In FIG. 6A and FIG. 6B, firstly the photoresist 206 is removed, then a second gate dielectric layer 207 is formed on the first conductive layer 205 and the exposed first gate dielectric layer 204, then a second conductive layer 208 is formed on the second gate dielectric layer 207, and then another patterned photoresist 209 is formed on the second conductive layer to define a word line (WL) region.

Specifically, a material of the second gate dielectric layer 207 comprises any one of oxide (such as silicon oxide) and nitride (such as silicon nitride), or the second gate dielectric layer 207 sequentially comprises a first oxide layer (such as silicon oxide), a nitride layer (such as silicon nitride) and a second oxide layer (such as silicon oxide) from bottom to top, wherein a thickness range of the first oxide layer is 3 nm-7 nm, a thickness range of the nitride layer is 4 nm-8 nm and a thickness range of the second oxide layer is 3 nm-7 nm.

Specifically, a thickness range of the second conductive layer is 80 nm-250 nm. In this embodiment, a material of the second conductive layer 208 is N-type polycrystalline silicon. The patterned photoresist may be realized through a photolithographic process.

Figure 7A:
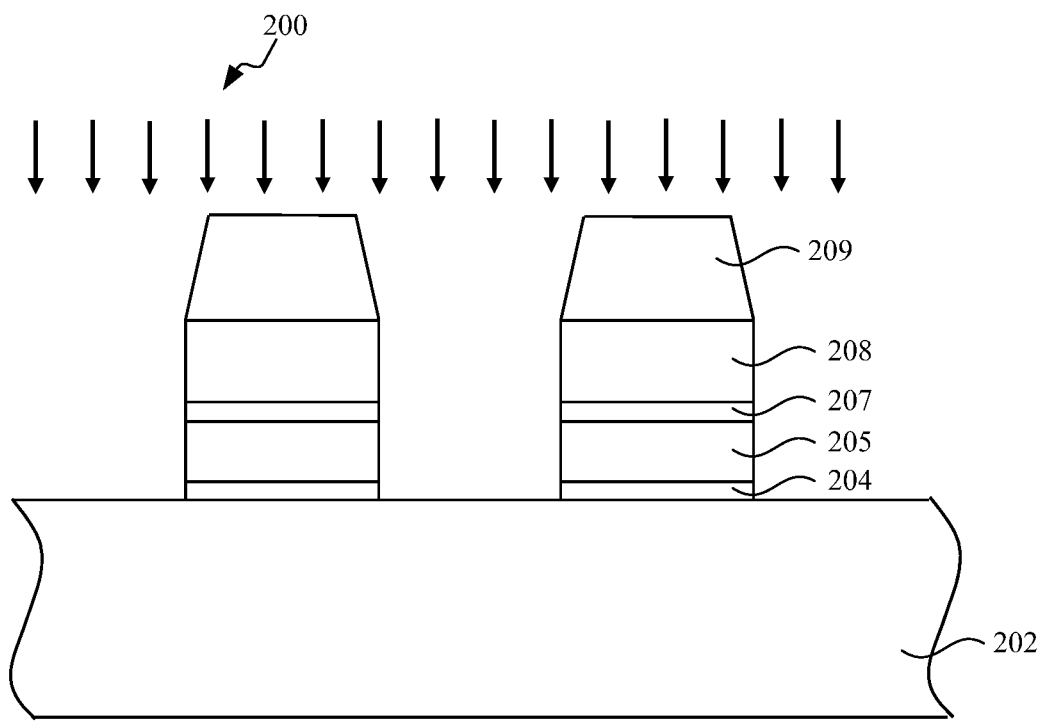
Figure 7B:
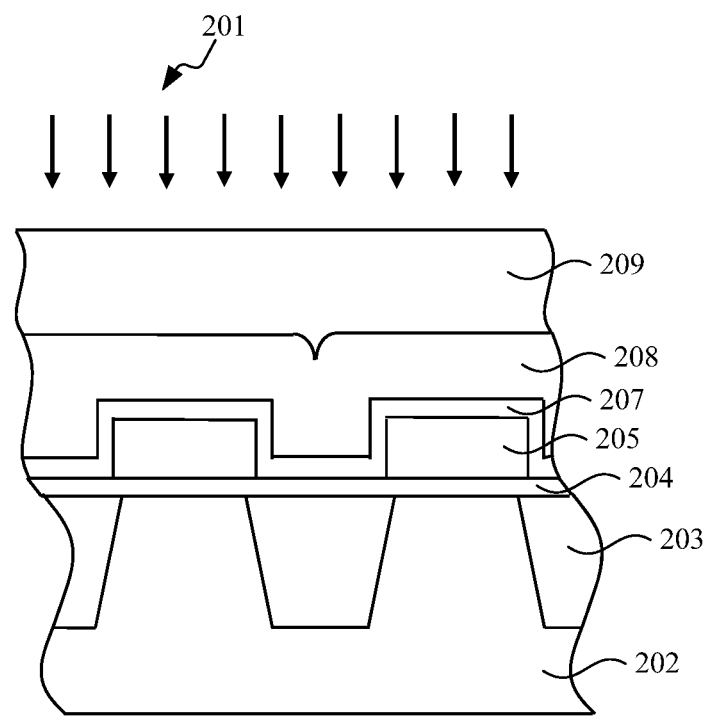

In FIG. 7A and FIG. 7B, firstly anisotropic etching is adopted to remove the portion, which is not covered by the photoresist 209, of the second conductive layer 208 to form a word line, then anisotropic etching is adopted to remove the exposed second gate dielectric layer 207, then anisotropic etching is adopted to remove the portion, which is not covered by the photoresist, of the first conductive layer 205, to form a stacked gate structure, and the gate structure sequentially comprises a first gate dielectric layer 204, a first conductive layer 205, a second gate dielectric layer 207 and a second conductive layer 208 from bottom to top. FIG. 7A and FIG. 7B illustrate directions of anisotropic etching by using arrows.

In this embodiment, the exposed first gate dielectric layer 204 may also be selectively further removed. In order to avoid Si damage, wet etch is preferably adopted.

Figure 8A:
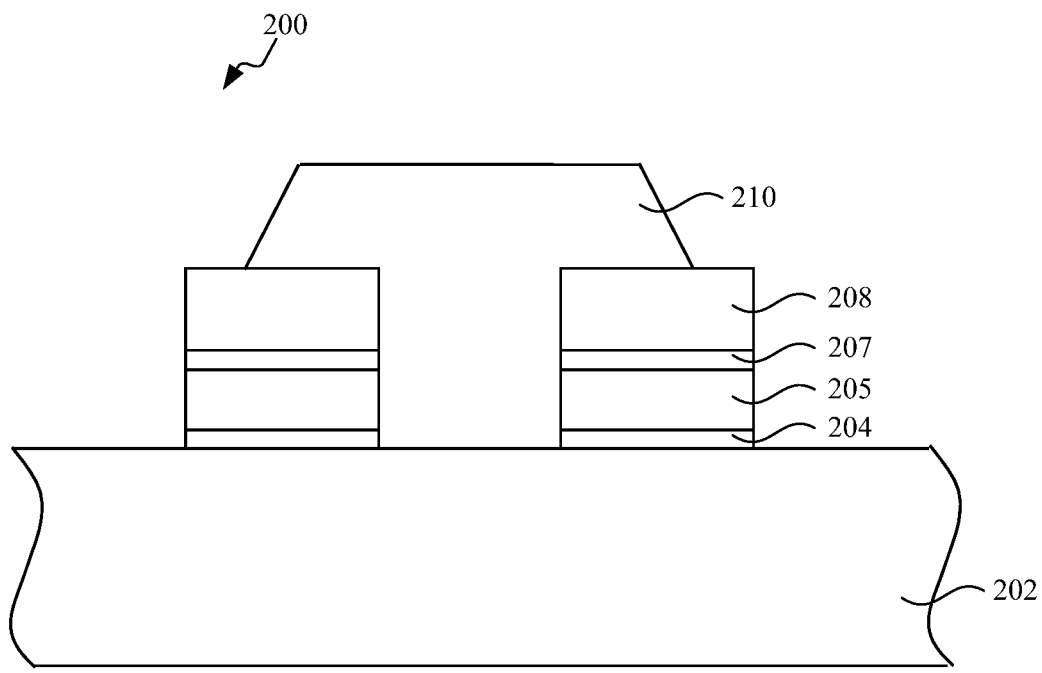
Figure 8B:
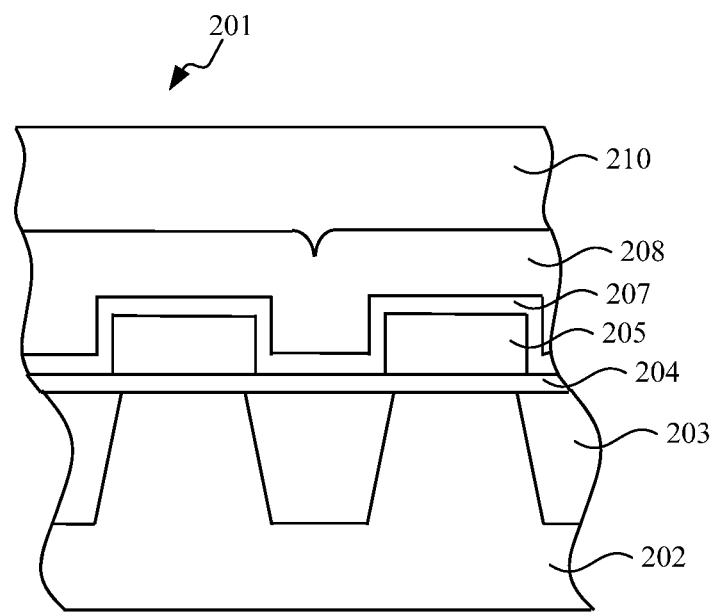

In FIG. 8A and FIG. 8B, firstly the photoresist 209 is removed, then another patterned photoresist 210 is formed to cover the source region and expose the drain region, wherein the source region and the drain region are respectively located at two ends of the gate structure. The patterned photoresist may be realized through a photolithographic process.

Figure 9A:
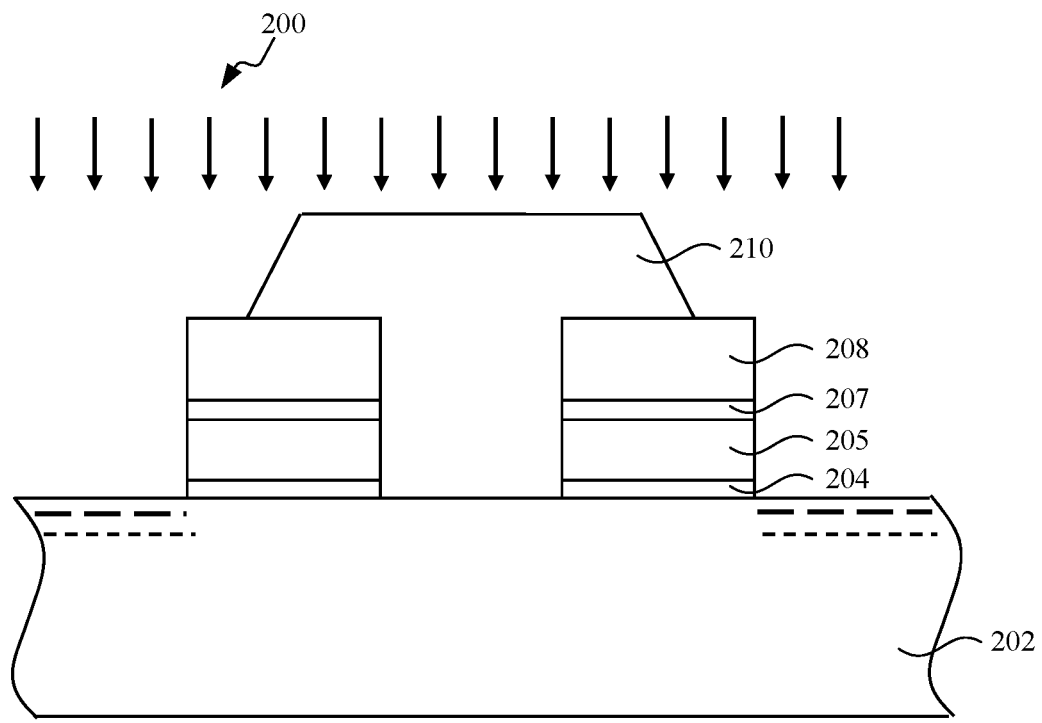
Figure 9B:
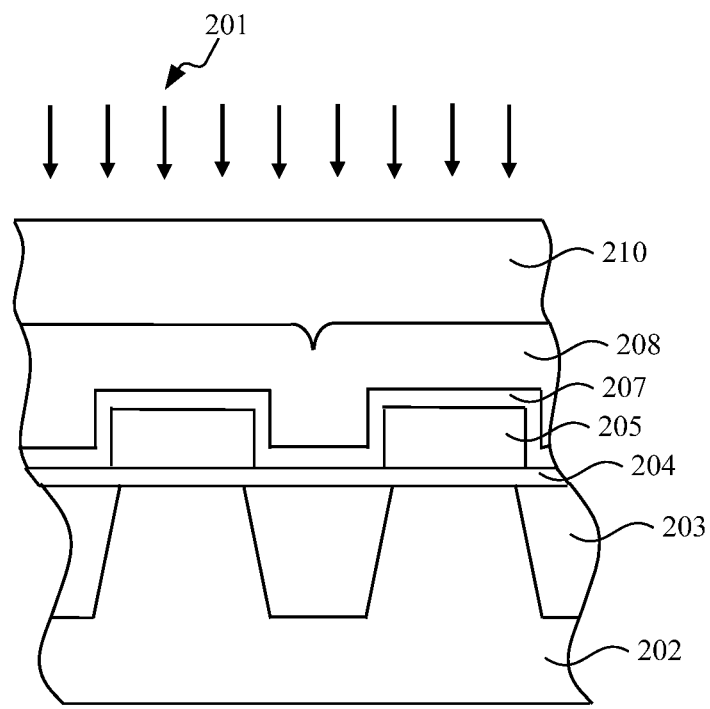

In FIG. 9A and FIG. 9B, firstly N-type ion implantation such as phosphorus implantation is performed, then P-type ion implantation such as boron implantation or boron fluoride ($BF_2$) implantation is performed. FIG. 9A and FIG. 9B illustrate directions of ion implantation by using arrows. In this embodiment, the implantation direction is preferably y direction, i.e., vertical implantation is performed. In other embodiments, inclined implantation may also be performed, but it would be better that an inclination angle is not greater than 7° to avoid a channeling effect. FIG. 9A further illustrates an N-type ion implantation position by using a short dashed line and illustrates a P-type ion implantation position by using a long dashed line, wherein a depth of N-type ion implantation is greater and a depth of P-type ion implantation is smaller. As an example, an energy range of the N-type ion implantation is 50 KeV-100 KeV, a dosage range is $1E13\ cm^{-2}$-$9E14\ cm^{-2}$, an energy range of the P-type ion implantation is 5 KeV-30 KeV and a dosage range is $1E15\ cm^{-2}$-$8E15\ cm^{-2}$.

Figure 10A:
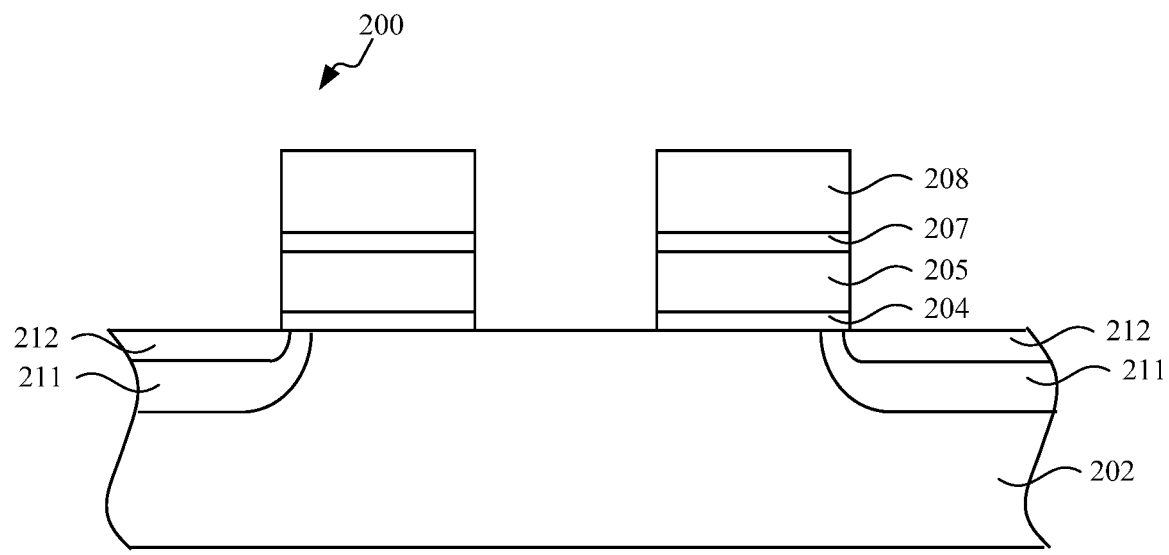
Figure 10B:
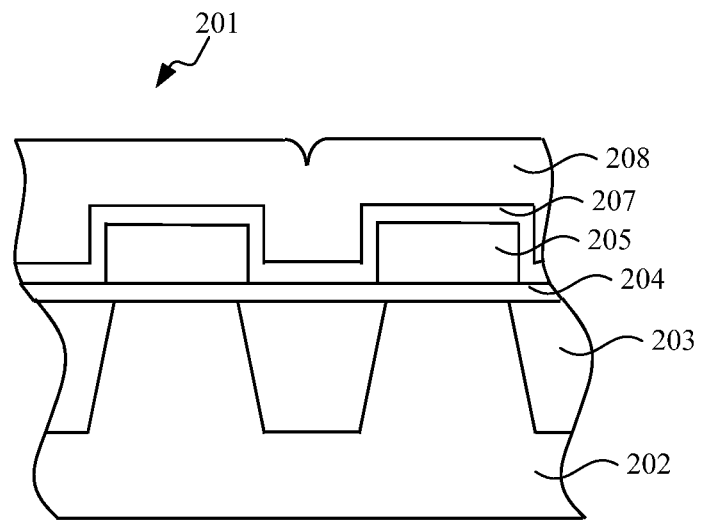

In FIG. 10A and FIG. 10B, firstly the photoresist 210 is removed, then a anneal cycle such as Rapid Thermal Anneal (RTA) is performed to repair implantation damages, the dopant is driven in to form an N-type doped drain region 211 in the drain region and a P-type heavily doped drain region 212 formed in the N-type doped drain region 211, the N-type doped drain region 211 and the P-type heavily doped drain region 212 both horizontally extend to positions below the gate structure and partially overlap with the gate structure.

It needs to be pointed out that, if a subsequent anneal cycle is enough to repair the ion implementation damage at the current time and drive in the dopant, then the anneal cycle step of this step may be omitted.

Figure 11A:
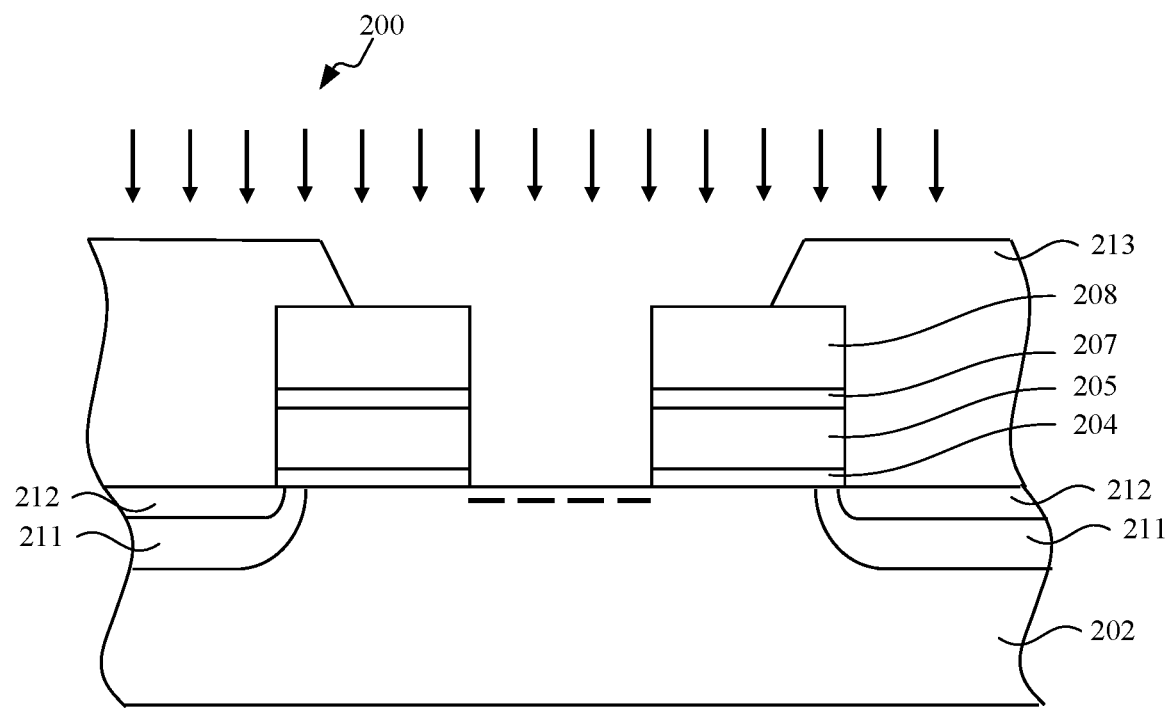
Figure 11B:
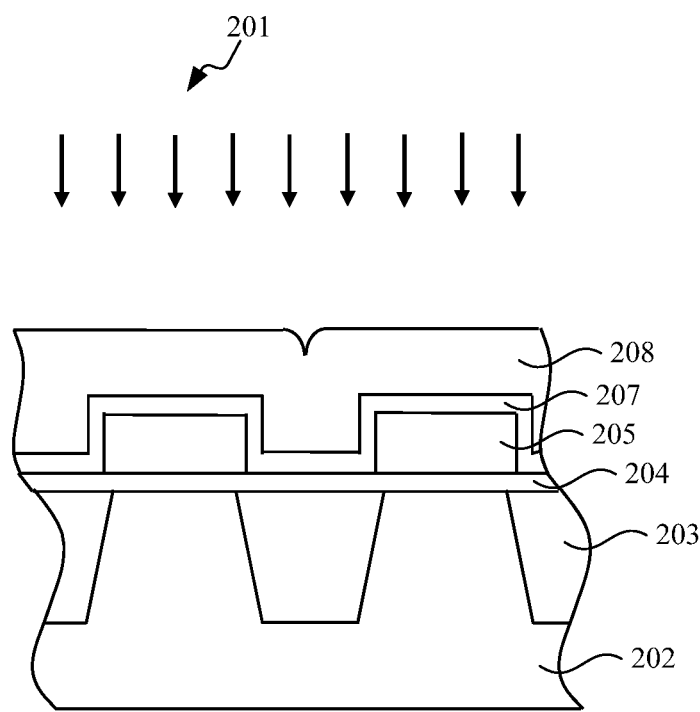

In FIG. 11A and FIG. 11B, firstly another patterned photoresist 213 is formed to cover the drain region and expose the source region, then N-type ion implantation is performed, for example at least one of arsenic and phosphorous is adopted to perform implantation. FIG. 11A and FIG. 11B illustrate directions of ion implantation by using arrows. In the present embodiment, an implantation direction is preferably y direction, i.e., vertical implantation is performed. In other embodiments, inclined implantation may also be performed but it would be better that an inclination angle is not greater than 7° to avoid a channeling effect. FIG. 11A further illustrates an N-type ion implantation position by using a long dashed line. In this embodiment, a dosage range of the N-type ion implantation at the current time is $1E15\ cm^{-2}$-$9E16\ cm^{-2}$.

Figure 12A:
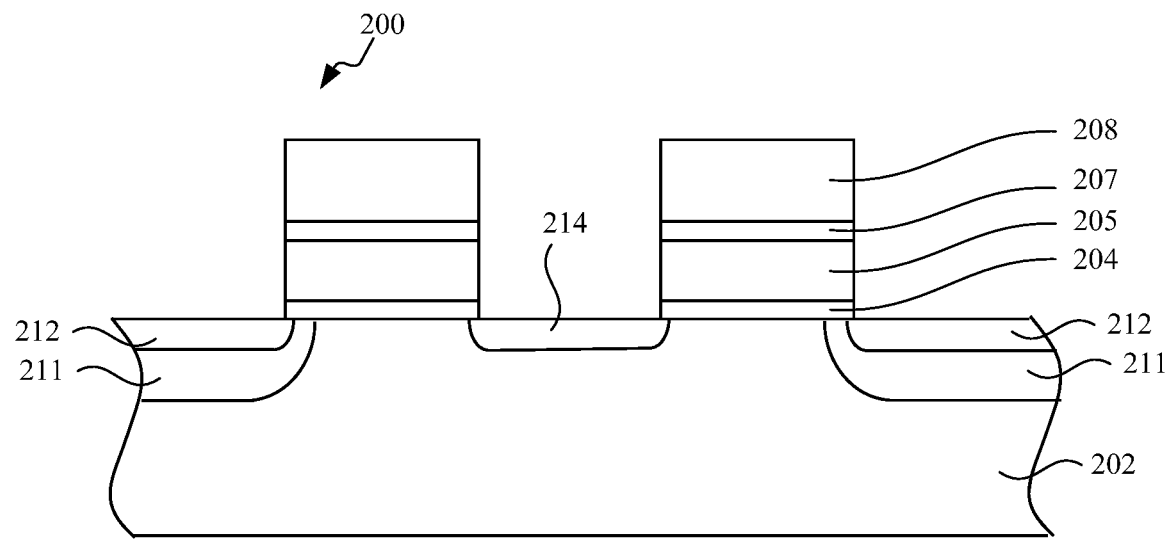
Figure 12B:
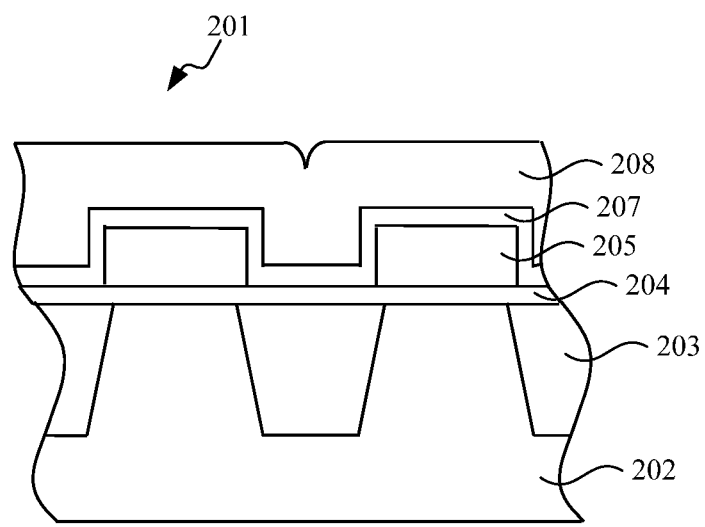

In FIG. 12A and FIG. 12B, firstly the photoresist 213 is removed, then a anneal cycle is performed, e.g., RTA is adopted, to repair implantation damages, and the dopant is driven in to form an N-type heavily doped source region 214 in the source region. In the present embodiment, the N-type heavily doped source region 214 horizontally extends to a position below the gate structure and partially overlaps with the gate structure.

Figure 13A:
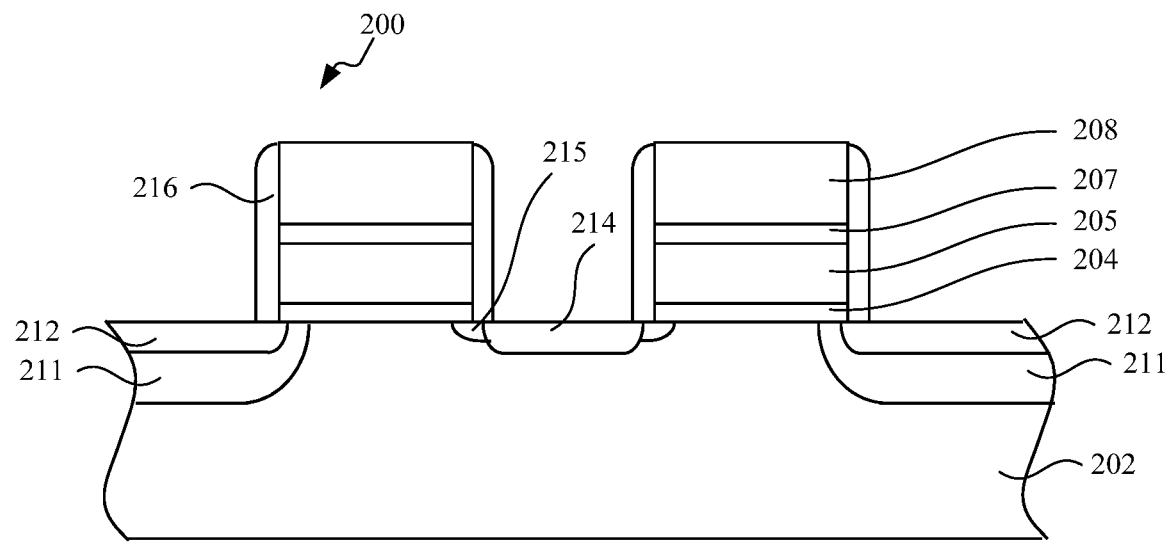
Figure 13B:
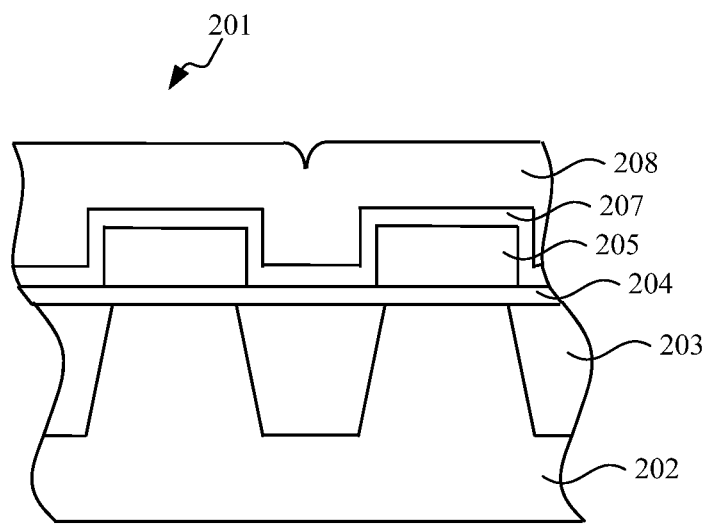

As an alternative solution, in FIG. 13A and FIG. 13B, an N-type lightly doped source region 215 is further formed in the source region, the N-type lightly doped source region 215 horizontally extends to a position below the gate structure and partially overlaps with the gate structure, and then a sidewall spacer 216 is formed on both sides of the gate structure, then an N-type heavily doped source region 214 is formed, and two ends of the N-type heavily doped source region 214 are connected to the N-type lightly doped source region 215.

Figure 14A:
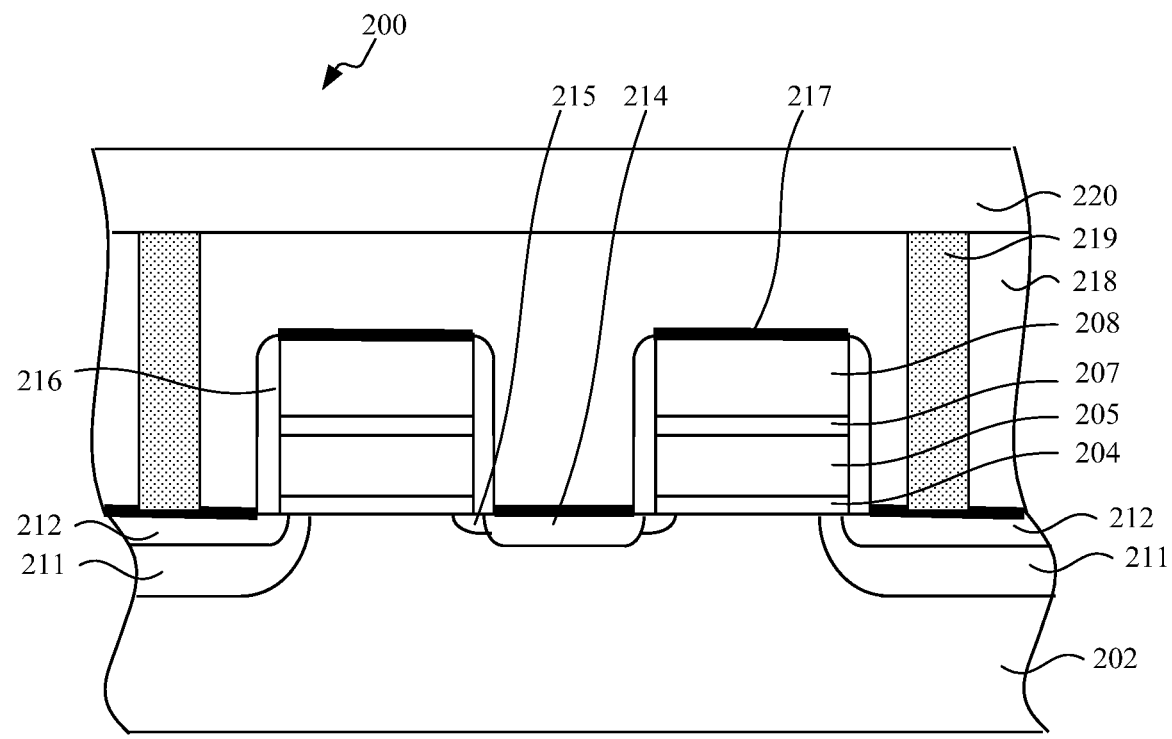
Figure 14B:
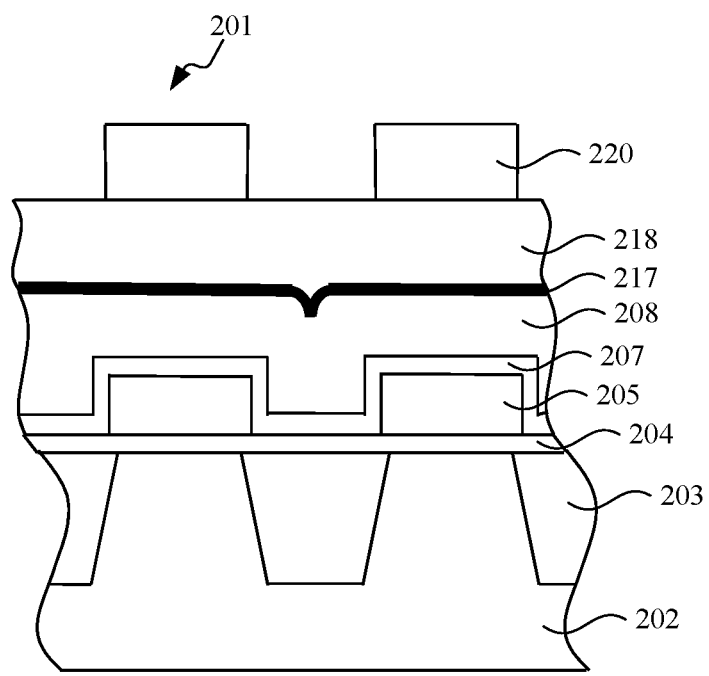

In FIG. 14A and FIG. 14B, a conventional integrated circuit backend manufacturing process is continued, a self-aligned silicide layer 217 is formed on a surface of the second conductive layer 208, a surface of the P-type heavily doped drain region 212 and a surface of the N-type heavily doped source region 214, an interlayer dielectric layer 218 covering the gate structure is formed on the substrate 202, a contact plug 219 is formed in the interlayer dielectric layer 218 and a metal bit line 220 is formed on the interlayer dielectric layer 218, wherein a top end of the contact plug 219 is connected to the metal bit line 220, and a bottom end of the contact plug 219 is connected to the drain region.

It needs to be pointed out that the self-aligned silicide layer 217 is an alternative solution and the self-aligned silicide layer 217 may not be formed in other embodiments. Under this situation, the sidewall spacer 216 also may not be selectively formed on both sides of the gate structure and the N-type lightly doped source region 215 also may not be selectively formed. In the solution that the N-type lightly doped source region 215 is not formed, the N-type heavily doped source region 214 horizontally extends to a position below the gate structure and partially overlaps with the gate structure.

Figure 15A:
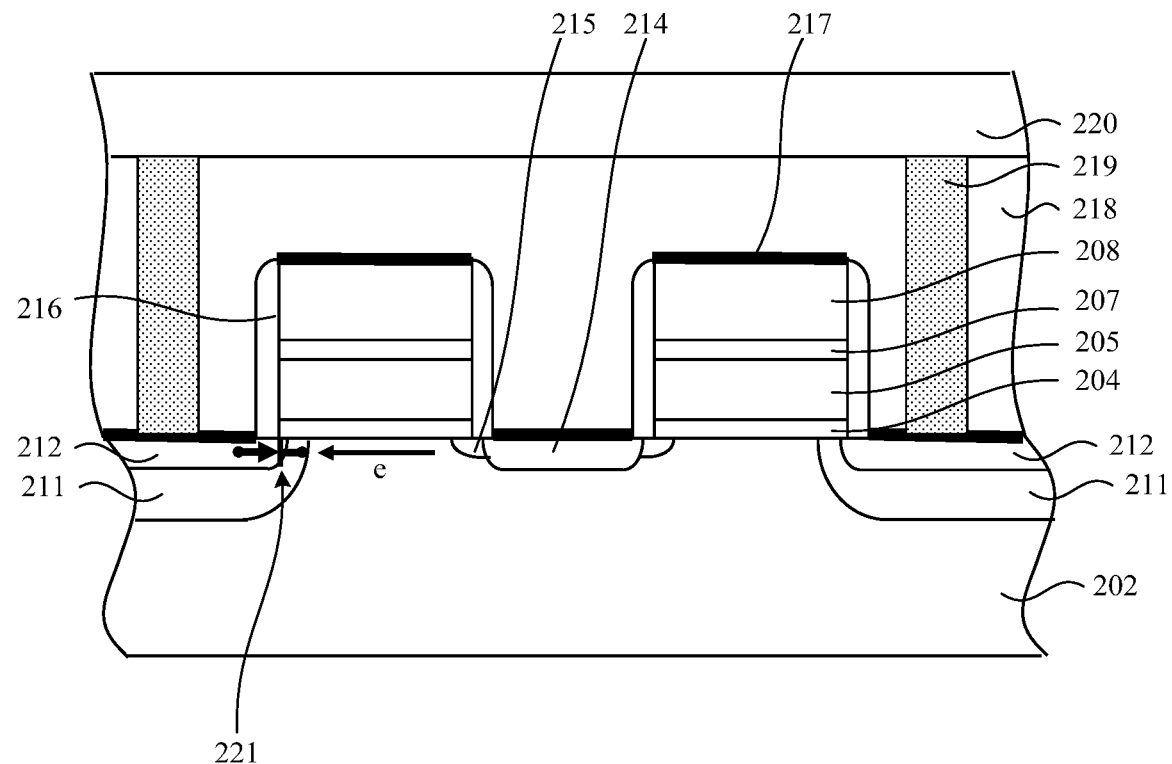
FIG. 15A illustrates a schematic diagram of a reading operation of a memory transistor formed in FIGS. 2A-2B, 3A-3B, 4A-4B, 5A-5B, 6A-6B, 7A-7B, 8A-8B, 9A-9B, 10A-10B, 11A-11B, 12A-12B, 13A-13B, and 14A-14B.

FIG. 15A illustrates a schematic diagram of a reading operation of a memory transistor formed in FIG. 2A to FIG. 14B. During reading, a memory cell on a left side is selected, a memory cell on a right side is not selected, the memory cell is a first parasitic diode 221 consisting of the P-type heavily doped drain region 212 and the N-type doped drain region 211, and electrons e flow from the source region to the drain region and can generate a relatively high N-channel current. FIG. 15 illustrates a direction of current by using arrows.

Figure 15B:
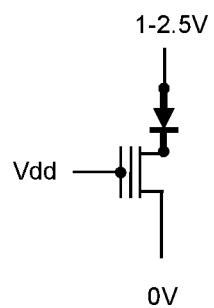
FIG. 15B illustrates a cell circuit under a reading bias condition.

The memory transistor may be read through a suitable bias condition. Table 1 lists an exemplary reading bias condition of the memory transistor. FIG. 15B illustrates a cell circuit under this reading bias condition.

TABLE 1

| Reading bias condition | |
| --- | --- |
| Selected word line | Vdd |
| Selected bit line | 1-2.5 V |
| All others | 0 V |

Figure 16A:
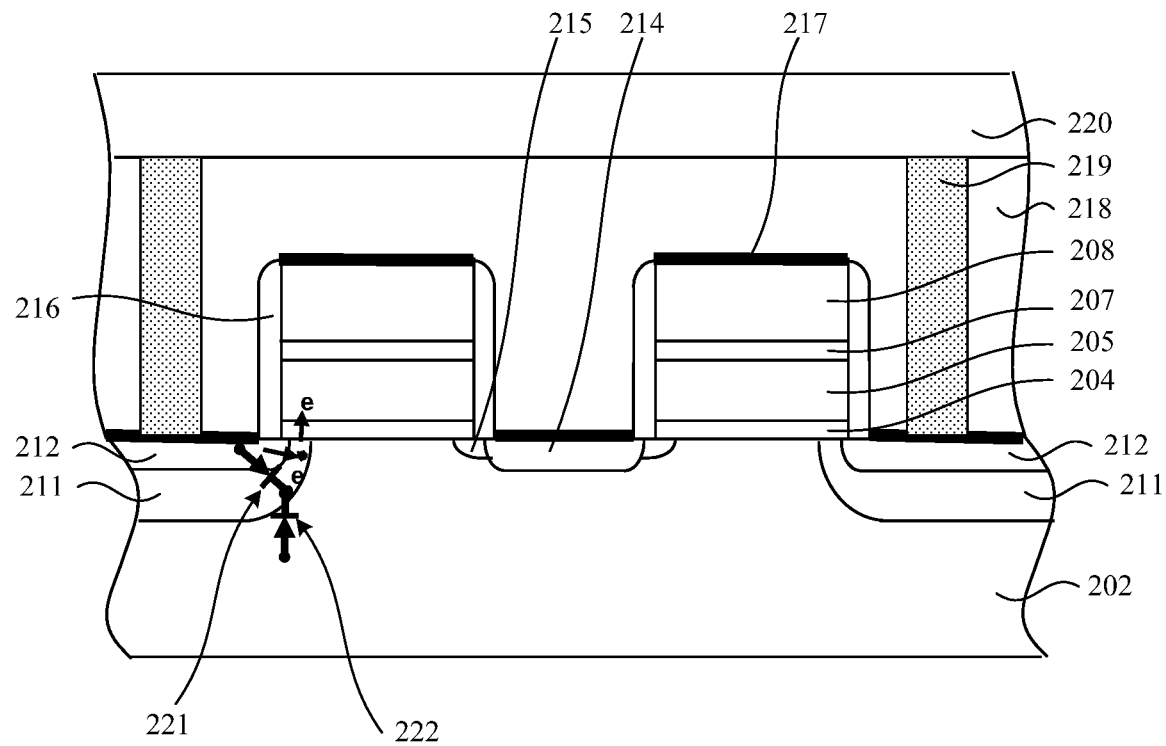
FIG. 16A illustrates a schematic diagram of a programming operation of a memory transistor formed in FIGS. 2A-2B, 3A-3B, 4A-4B, 5A-5B, 6A-6B, 7A-7B, 8A-8B, 9A-9B, 10A-10B, 11A-11B, 12A-12B, 13A-13B, and 14A-14B.

FIG. 16A illustrates a schematic diagram of a programming operation of a memory transistor formed in FIG. 2A to FIG. 14B. During programming, a memory cell on a left side is selected, a memory cell on a right side is not selected, the P-type heavily doped drain region 212 and the N-type doped drain region 211 form a first parasitic diode 221, the substrate 202 and the N-type doped drain region 211 form a second parasitic diode 222, band-to-band tunneling occurs from the P-type heavily doped drain region 212 to the N-type doped drain region 211 of the drain region, thus causing impact ionization, so that electrons e are directly implanted from the drain region to the floating gate, while no channel current is generated, the number of required electrons is greatly reduced and the programming current is relatively low. FIG. 16A illustrates a path of electrons e by using arrows.

Figure 16B:
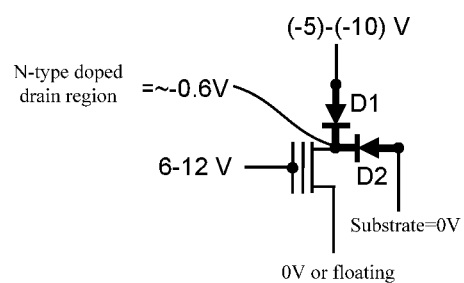
FIG. 16B illustrates a cell circuit under a programming bias condition.

The memory transistor may be programmed through a suitable bias condition. Table 2 lists an exemplary programming bias condition of the memory transistor. FIG. 16B illustrates a cell circuit under this programming bias condition, wherein voltage of the N-type doped drain region is about 0.6V and voltage of the substrate is 0V.

TABLE 2

| Programming bias condition | |
| --- | --- |
| Selected word line | 6-12 V |
| Unselected word line | 1-2.5 V |
| Source line | 0 V or floating |
| Selected bit line | (−5)-(−10) V |
| Unselected bit line | 0 V |
| All others | 0 V |

Figure 17:
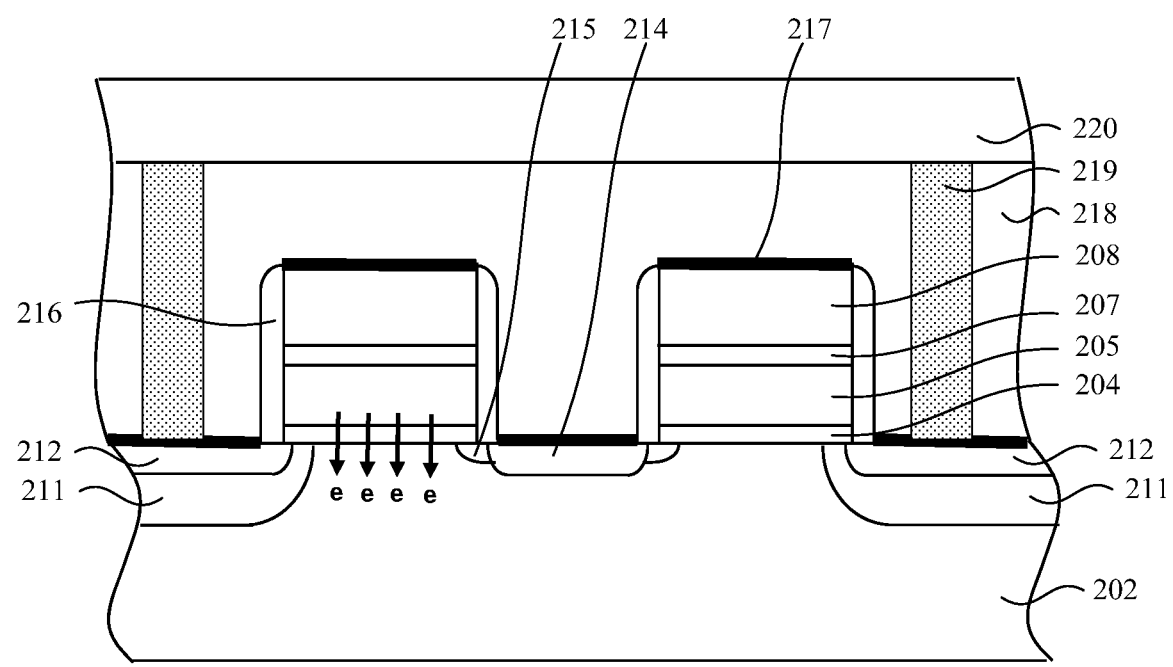
FIG. 17 illustrates a schematic diagram of an erasing operation of a memory transistor formed in FIGS. 2A-2B, 3A-3B, 4A-4B, 5A-5B, 6A-6B, 7A-7B, 8A-8B, 9A-9B, 10A-10B, 11A-11B, 12A-12B, 13A-13B, and 14A-14B.

FIG. 17 illustrates a schematic diagram of an erasing operation of a memory transistor formed in FIG. 2A to FIG. 14B. During erasing, charges stored in the floating gate conductive layer penetrate through the first gate dielectric layer by means of direct FN tunneling and enter the substrate and/or source-drain regions, the erasing gate can be divided into sectors or blocks, and an erasing operation can be performed on the sectors or blocks under this situation. FIG. 17 illustrates a path of electrons e by using arrows.

The memory transistor may be erased through a suitable bias condition. Table 3 lists an exemplary erasing bias condition of the memory transistor.

TABLE 3

| Erasing bias condition | |
| --- | --- |
| Selected word line | (−8)-(−15) V |
| Unselected word line | 0 V |
| Bit line | 0 V or Vdd |
| All others | 0 V |

It needs to be pointed out that, if a triple-well structure is adopted for replacing a pure P-type substrate, e.g., a P-type substrate comprises a relatively deep N-well and a P-well is formed in the N-well, the erasing bias condition may be different. Table 4 lists an exemplary erasing bias condition of the memory transistor when the substrate adopts the triple-well structure.

TABLE 4

| Erasing bias condition | |
| --- | --- |
| Selected word line | (−5)-(−8) V |
| Unselected word line | 0 V |
| Bit line and source line | Floating |
| Selected P-well | 5-8 V |

It can be seen that the memory transistor has a band-to-band tunneling programming ability and reserves the advantage of relatively high reading current of an N-channel at the same time.

It needs to be pointed out that the doping type of each region of the above-mentioned non-volatile memory may be varied, e.g., the original P-type doped region is varied to an N-type doped region and an original N-type doped region is varied to a P-type doped region, so as to obtain the P-channel non-volatile memory cell and array thereof.

To sum up, the non-volatile memory cell provided by the present invention adopts a dual-layer conductive layer (which may be polycrystalline silicon) structure, wherein the lower conductive layer is used as a floating gate, the upper conductive layer is used as a word line, when the non-volatile memory cell and array provided by the present invention are programmed, band-to-band tunneling occurs from the P-type heavily doped drain region to the N-type doped drain region of the drain region, thus causing impact ionization, electrons are directly implanted from the drain region to the floating gate, no channel current is generated, the number of required electrons is greatly reduced and the programming current is relatively low. When the non-volatile memory cell and array provided by the present invention are read, electrons flow from the source region to the drain region and relatively high N-channel current is generated. When the non-volatile memory cell and array provided by the present invention are erased, charges stored in the floating gate conductive layer penetrate through the first gate dielectric layer by means of direct FN tunneling and enter the substrate and/or source-drain regions, the erasing gate can be divided into sectors or blocks, and an erasing operation can be performed on the sectors or blocks under this situation. The non-volatile memory cell and array provided by the present invention have a band-to-band tunneling programming ability and reserve the advantage of relatively high reading current of an N-channel at the same time. Therefore, the present invention effectively overcomes various disadvantages in the prior art and thus has a great industrial utilization value.

The above-mentioned embodiments are just used for exemplarily describing the principle and effects of the present invention instead of limiting the present invention. One skilled in the art may make modifications or changes to the above-mentioned embodiments without departing from the spirit and scope of the present invention. Therefore, all equivalent modifications or changes made by those who have common knowledge in the art without departing from the spirit and technical thought disclosed by the present invention shall be still covered by the claims of the present invention.

What is claimed is:

1. A non-volatile memory cell, characterized in that the non-volatile memory cell comprises:
   a substrate;
   a gate structure formed on the substrate, wherein the gate structure sequentially comprises a first gate dielectric layer, a first conductive layer, a second gate dielectric layer and a second conductive layer from bottom to top;
   a source region formed in the substrate, wherein the source region comprises an N-type heavily doped source region; and
   a drain region formed in the substrate, wherein the drain region comprises an N-type doped drain region and a P-type heavily doped drain region formed in the N-type doped drain region, wherein the source region and the drain region are respectively located at two ends of the gate structure, and the N-type doped drain region and the P-type heavily doped drain region both horizontally extend to positions below the gate structure and partially overlap with the gate structure.

2. The non-volatile memory cell according to claim 1, characterized in that the source region further comprises an N-type lightly doped source region, wherein the N-type lightly doped source region is connected to two ends of the N-type heavily doped source region, horizontally extends to a position below the gate structure and partially overlaps with the gate structure.

3. The non-volatile memory cell according to claim 1, characterized in that the non-volatile memory cell further comprises a sidewall spacer, wherein the sidewall spacer is formed on both sides of the gate structure.

4. The non-volatile memory cell according to claim 1, characterized in that non-volatile memory cell further comprises a silicide layer, wherein the silicide layer is distributed on a surface of the second conductive layer, a surface of the P-type heavily doped drain region and a surface of the N-type heavily doped source region.

5. The non-volatile memory cell according to claim 1, characterized in that non-volatile memory cell further comprises an interlayer dielectric layer, a metal bit line and at least one contact plug, wherein the interlayer dielectric layer is formed on the substrate and covers the gate structure, the metal bit line is formed on the interlayer dielectric layer, the contact plug is formed in the interlayer dielectric layer, a top end of the contact plug is connected to the metal bit line, and a bottom end of the contact plug is connected to the drain region.

6. The non-volatile memory cell according to claim 1, characterized in that the substrate is a P-type doped substrate.

7. The non-volatile memory cell according to claim 1, characterized in that the substrate is a triple-well structure comprising an N-well formed in the substrate and a P-well formed in the N-well.

8. The non-volatile memory cell according to claim 1, characterized in that a thickness of the first gate dielectric layer is in a range of 7 nm-15 nm, a thickness of the first conductive layer is in a range of 30 nm-200 nm, and a thickness of the second conductive layer is in a range of 80 nm-250 nm.

9. The non-volatile memory cell according to claim 1, characterized in that a material of the first gate dielectric layer comprises any one of oxide and oxynitride, a material of the second gate dielectric layer comprises any one of oxide and nitride, or the second gate dielectric layer sequentially comprises a first oxide layer, a nitride layer and a second oxide layer from bottom to top, a thickness of the first oxide layer is in a range of 3 nm-7 nm, a thickness of the nitride layer is in a range of 4 nm-8 nm, and a thickness of the second oxide layer is in a range of 3 nm-7 nm.

10. The non-volatile memory cell according to claim 1, characterized in that a material of the first conductive layer comprises N-type polycrystalline silicon, and a material of the second conductive layer comprises N-type polycrystalline silicon.

11. The non-volatile memory cell according to claim 1, characterized in that a dosage of the N-type doped drain region is in a range of $1E13\ cm^{-2}$-$9E14\ cm^{-2}$, a dosage of the P-type heavily doped drain region is in a range of $1E15\ cm^{-2}$-$8E15\ cm^{-2}$, and a dosage of the N-type heavily doped source region is in a range of $1E15\ cm^{-2}$-$9E16\ cm^{-2}$.

12. A non-volatile memory array, characterized in that a band-to-band tunneling programming N-channel non-volatile memory array comprises the non-volatile memory cell according to claim 1.

13. A method for fabricating a non-volatile memory, characterized in that the method comprises the following steps:
   providing a substrate;
   forming a gate structure on the substrate, wherein the gate structure sequentially comprises a first gate dielectric layer, a first conductive layer, a second gate dielectric layer and a second conductive layer from bottom to top;
   forming a source region in the substrate, wherein the source region comprises an N-type heavily doped source region; and
   forming a drain region in the substrate, wherein the drain region comprises an N-type doped drain region and a P-type heavily doped drain region formed in the N-type doped drain region, wherein the source region and the drain region are respectively located at two ends of the gate structure, and the N-type doped drain region and the P-type heavily doped drain region both horizontally extend to positions below the gate structure and partially overlap with the gate structure, respectively.

14. The method for fabricating the non-volatile memory according to claim 13, characterized in that forming the N-type doped drain region and the P-type heavily doped drain region comprises the following steps:
   performing N-type ion implantation in the drain region;
   performing P-type ion implantation in the drain region, wherein an implantation depth of P-type ions is smaller than an implantation depth of N-type ions; and
   performing an anneal cycle to obtain the N-type doped drain region and the P-type heavily doped drain region.

15. The method for fabricating the non-volatile memory according to claim 14, characterized in that an energy of the N-type ion implantation is in a range of 50 KeV-100 KeV, a dosage is in a range of $1E13$ $cm^{-2}$-$9E14$ $cm^{-2}$, an energy of the P-type ion implantation is in a range of 5 KeV-30 KeV, and a dosage is in a range of $1E15$ $cm^{-2}$-$8E15$ $cm^{-2}$.

16. The method for fabricating the non-volatile memory according to claim 13, characterized in that forming the N-type heavily doped source region comprises the following steps:

performing N-type ion implantation in the source region; and performing an anneal cycle to obtain the N-type heavily doped source region.

17. The method for fabricating the non-volatile memory according to claim 16, characterized in that a dosage of the N-type ion implantation is in a range of $1E15$ $cm^{-2}$-$9E16$ $cm^{-2}$.

18. The method for fabricating the non-volatile memory according to claim 13, characterized in that, before forming the N-type heavily doped source region, the method further comprises the following steps:

forming an N-type lightly doped source region in the source region; and forming a sidewall spacer on both sides of the gate structure, wherein two ends of the N-type heavily doped source region are connected to the N-type lightly doped source region.

19. The method for fabricating the non-volatile memory according to claim 13, characterized in that the method further comprises the following steps:

forming a self-aligned silicide layer on a surface of the second conductive layer, a surface of the P-type heavily doped drain region and a surface of the N-type heavily doped source region;

forming an interlayer dielectric layer on the substrate to cover the gate structure;

forming a contact plug in the interlayer dielectric layer, wherein a bottom end of the contact plug is connected to the drain region; and forming a metal bit line on the interlayer dielectric layer, wherein a top end of the contact plug is connected to the metal bit line.

20. The method for fabricating the non-volatile memory according to claim 13, characterized in that the substrate is a triple-well structure comprising an N-well formed in the substrate and a P-well formed in the N-well.

* * * * *